United States Patent [19]

St. Angelo et al.

[11] Patent Number: 5,118,362
[45] Date of Patent: Jun. 2, 1992

[54] ELECTRICAL CONTACTS AND METHODS OF MANUFACTURING SAME

[75] Inventors: David A. St. Angelo, Lowell; Frank J. Bottari, Acton; Christopher E. Dube, Arlington, all of Mass.

[73] Assignee: Mobil Solar Energy Corporation, Billerica, Mass.

[21] Appl. No.: 586,894

[22] Filed: Sep. 24, 1990

[51] Int. Cl.$^5$ .................... H01L 31/04; H01L 31/18; H01L 31/0224
[52] U.S. Cl. ........................... 136/256; 357/30; 357/71; 437/2; 437/189; 437/194; 437/199; 437/203
[58] Field of Search .......................... 437/2–5, 437/189, 194, 199, 202–204; 136/256; 357/30 J, 30 Q, 71

[56] References Cited

FOREIGN PATENT DOCUMENTS 59-117276 7/1984 Japan ................................. 136/256
62-237765 10/1987 Japan ................................. 136/256

OTHER PUBLICATIONS

A. Ricaud et al., *Proceedings 6th E.C. Photovoltaic Solar Energy Conference* (1985), pp. 1056–1059.
G. C. Cheek et al., *IEEE Trans. Electron Devices*, vol. ED-31, pp. 602–609 (1984).

*Primary Examiner*—Aaron Weisstuch
*Attorney, Agent, or Firm*—Pandiscio & Pandiscio

[57] ABSTRACT

Nickel is introduced into the construction of the rear electrical contacts on silicon solar cells to reduce contact resistance between the aluminum contact material and the silver pads. In one embodiment, the nickel is applied as an intermediate layer between the silicon substrate and each silver pad. In a second and preferred embodiment, the nickel is incorporated into the silver ink that is used to make the soldering pads. Specifically, the invention provides a "double-fired" process for forming a rear contact on a solar cell wherein (1) a windowed aluminum layer is first formed on the rear surface of a partially finished silicon solar cell by printing an aluminum ink or paste that contains a glass frit, (2) the aluminum ink or paste is fired without any intervening drying step, (3) soldering pads are formed by printing a silver/nickel/glass frit ink or paste so as to fill and overlap the windows, and (4) the silver/nickel/glass frit ink or paste is fired so as to cause the constituents thereof to make an ohmic bond with the silicon substrate. The foregoing procedure is integrated with the formation of a silver grid contact on the front side of the solar cell substrate in a conventional manner and firing that grid contact simultaneously with the silver soldering pads so as to form an ohmic contact with the front surface of the substrate.

36 Claims, 2 Drawing Sheets

ELECTRICAL CONTACTS AND METHODS OF MANUFACTURING SAME

This invention relates to a method of producing low resistance, solderable electrical contacts employing aluminum, and more particularly to the manufacture of solar cells and to an improved method of forming ohmic contacts on solar cells.

BACKGROUND

Heretofore much effort has been devoted to the fabrication of electrical contacts on semiconductor devices, and numerous problems have been encountered in attempting to provide low resistance, solderable ohmic contacts. The fabrication of low resistance, solderable electrical contacts is especially critical in the case of photovoltaic solar cells, since it is well known that the operating characteristics of solar cells are affected by the nature and quality of their front and rear contacts, and also that commercial acceptance of solar cells is conditioned upon the ability to produce reliable, efficient and long-lasting cells and solar cell modules. As used herein, the term "solar cell module" means a plurality of solar cells that are interconnected electrically and physically so as to form a discrete array that provides a predetermined voltage output, e.g., a typical module may consist of 216 cells connected together so as to have a total power output of 220 watts. A selected number of such modules may be connected together to form a solar panel having a desired power output.

One form of photovoltaic solar cell comprises a relatively flat silicon substrate (e.g., a poly-crystalline silicon substrate produced by the EFG crystal growth method) having broad front and back surfaces, a P/N junction formed adjacent its front surface, a first grid-shaped contact or electrode overlying and bonded to the front surface (the "front contact"), and a second flat contact or electrode overlying and bonded to the back surface (the "back contact").

Aluminum, because of its low cost and good electrical conductivity, is the most common material used to fabricate the back contacts of solar cells. It alloys with the silicon so as to form a bond with an acceptable peel strength. However, for purposes of cell interconnections, the back contacts need to be solderable. Unfortunately aluminum tends to form a surface oxide when it is exposed to air. That surface oxide does not prevent the aluminum layer from carrying current generated by the cell; however, it does increase contact resistance to an overlying layer such as a copper conductor, and also inhibits direct soldering.

Heretofore extensive efforts to improve the quality and reduce the costs of manufacturing solar cells have included steps to facilitate the making of solder connections to the aluminum back contacts and otherwise avoiding any deleterious effect from the surface oxide. Typically, the aluminum back contact is made by coating the rear side of a silicon substrate with an aluminum paste (also called an "ink") comprising aluminum particles suspended in an organic vehicle, and then firing the paste in air so as to remove the organic vehicle by evaporation and/or pyrolysis and cause the metal particles to alloy with the silicon substrate and thereby form an ohmic aluminum/silicon contact. Since the air-fired aluminum is not solderable using conventional solders, due to the presence of a surface oxide formed during firing, and since even a nitrogen fired aluminum tends to form a surface oxide when exposed to air, one prior method has involved removing the surface oxide by etching and forming a covering layer of nickel over the fired aluminum layer by an electroless deposition method, and then firing the nickel in a nitrogen atmosphere to bond it to the aluminum. Although the nitrogen-fired nickel is solderable (in contrast to air-fired nickel which is not solderable), a common practice has been to coat the nickel layer with a thin layer of copper or tin which is readily solderable. Copper ribbons or connecting strips are then soldered to the back contact so as to permit connecting the solar cell to other cells or to an exterior circuit. That prior method has a number of disadvantages, including excessive cost and the waste disposal problems associated with a wet electroless plating process.

Another known procedure involves (1) coating the back of the substrate with an aluminum paste so as to form a coating that is discontinuous in the sense that it defines a plurality of openings ("windows") through which the underlying silicon substrate is exposed, and (2) applying a layer of silver to the back of the substrate so as to fill the aforesaid apertures or windows and also overlap a limited amount of the aluminum layer, whereby to form a plurality of silver "contact pads", also called "soldering pads". Tin-coated copper strips are soldered to the silver pads to permit connecting the solar cell to adjacent solar cells. This procedure, described in copending U.S. patent application Ser. No. 561,101, filed Aug. 1, 1990 by Frank Bottari et al for "Method Of applying Metallized contacts To A Solar Cell", offers the advantages that the silver pads provide a plurality of soldering sites for making solder bonds.

Attempts to reduce the cost of manufacturing solar cells have involved investigation and use of a number of coating techniques for applying metallized contacts to the front and back surfaces of the solar cell.

One such known coating technique, commonly identified as screen printing, involves placing a screen having a metallization pattern formed therein on one side of a substrate. A metal screen printing ink is then spread over the metallization pattern in the screen and forced through the screen onto the surface of the underlying substrate by means of a narrow elongate blade which is moved across the screen in direct contact therewith. After removing the screen, the metallized ink is fired to drive off the binder in the ink and cause the metal in the ink to adhere to the substrate. Such screen printing methods are described in U.S. Pat. Nos. 4,293,451 and 4,388,346.

Screen printing may be used for applying contacts to substrates according to this invention, but its use is not preferred for applying back contacts to solar cell substrates which are relatively brittle and have irregular, uneven surfaces, e.g., EFG-grown silicon substrates. Unfortunately, application of metallized inks by screen printing to EFG-grown solar cell substrates can result in significant variation in the thickness of the printed contacts formed from the metallized inks. This variation in thickness is caused by the fact that the surfaces of EFG-grown substrates have undulations or random peaks and depressions with a flatness deviation in the range of 4 to 10 mils. Because the printing screen rests on the high points of an uneven or irregular substrate surface, the thickness of the metallized contacts formed by the screen printing process may vary significantly over the width and length of the metallized contact. Such variation in thickness can result in the excessive use of metal printing ink, thereby adding to the overall cost of the solar cell.

Additionally, if the metal ink is applied in a thickness greater than that required for satisfactory electrical current flow, as occurs with those portions of the screen printed contacts overlying the low spots of the substrate, the substrate may tend to bow as a result of stresses caused by the firing process which bonds the metal ink to the substrate. Such bowing is disadvantageous because it can make the attachment of discrete solar cells to a large solar cell array problematic. Screen printing metallized contacts on a solar cell substrate having uneven surfaces also is not preferred because of the increased risk of substrate breakage. Such tends to occur due to the relatively large forces applied, as measured on a per unit of surface area basis, to the substrate by the narrow blade used to spread the metal ink across the screen. In this connection it is to be appreciated that the typical solar cell substrate is not only brittle but also is relatively thin, usually having a thickness in the range of 0.011" to 0.022".

Techniques such as spraying or evaporative deposition have been considered for applying metallized contacts to a solar substrate. Unfortunately, such techniques involve masking and other limitations. Photolithography may also be used to apply metallized layers in the form of a pattern, such as that of a front surface grid electrode for a solar cell. However, photolithography adds to the time and cost of producing a solar cell substrate.

Most recently the efforts to reduce the cost of manufacturing solar cells has involved the application of pad printing techniques to form contacts. U.S. patent application Ser. No. 561,101, supra, discloses use of pad printing methods to form metal contacts on silicon substrates. The aforesaid application discloses formation of rear contacts by a pad printing method that involves the use of metal printing inks comprising metal particles in a liquid organic vehicle which usually comprises an organic binder and an organic solvent. The aforesaid application discloses a number of metal printing inks that are suitable for forming contacts by the pad printing method. All of the inks are formulated to ensure that (1) the metal particles in the ink will bond to the desired surface, (2) the fired metallized contacts have the desired conductivity, and (3) the inks can be applied easily and repetitively as a thick film having a thickness between about 2 to about 4 mils that will permit the fired contacts to have a thickness ranging from 4 to 10 microns. After the contacts have been applied by the pad printing process, the substrates are fired in a selected atmosphere to drive off the vehicle and securely bond the metal component of the ink to the substrate. The pad printing technique is preferred for the back contacts because it offers significant advantages: it permits formation of contacts at a relatively low cost, with high throughput rates and very low substrate breakage rates.

As noted above, U.S. patent application Ser. No. 561,101 specifically discloses the concept of (1) first forming a back contact on a silicon substrate using the "window" concept, e.g., an aluminum layer with a plurality of apertures ("windows") is formed by pad printing, and (2) then forming silver soldering pads in the windows by pad printing, with the aluminum layer and silver pads being fired to bond them to the silicon substrate.

As heretofore practiced, the "windows" concept of making rear contacts on solar cells using pad printing has been handicapped by the fact that the silver-aluminum contact is somewhat resistive, thus limiting the efficiency of the cell. Virtually the same resistance problem occurs if the aluminum contact has no windows and the silver pads are applied over the aluminum contact. It is recognized that ideally the contact resistance at the silver/aluminum interface should be low enough so as not to limit cell efficiency. Typically this means that the contact resistance should be below about 25 milliohms per silver soldering pad. However, heretofore the contact resistance has been substantially greater.

In the pad printing process described in U.S. patent application Ser. No. 561,101, supra, the aluminum ink is fired in nitrogen. Following that firing, the silver pads are applied and then fired in air. In this "double fired" process, the appearance of the aluminum back contact after the second firing is typically characterized by significant surface oxidation and surface irregularities, e.g., bumps in the aluminum back contact. Also the resulting aluminum back contact is especially sensitive to electrolyte-induced corrosion (determined by immersing the back contacts in 0.01M $NaClO_4$ solution for 20 hours). The electrolyte-induced corrosion appears to be substantially the same as the aluminum corrosion which occurs after 20 days in a HAST pressure chamber (the term "HAST" stands for highly accelerated stress test) operated at 106 degrees C. and 98% relative humidity. The electrolyte-induced corrosion is characterized by increased silver/aluminum resistance and visual darkening of the aluminum around the silver pads. The surface irregularities hinder cell processing and reduce the mechanical yield during module assembly. The tendency to electrolyte-induced corrosion reduces module life, particularly if no or an imperfect hermetic seal is provided in the backskin of the module that incorporates that solar cell.

Aluminum inks containing a glass frit have been used previously to form aluminum back contacts for solar cells. However, if the aluminum ink contains a glass frit, the contact resistance at the interface of the aluminum and the silver soldering pads is substantially greater than when the aluminum ink contains no glass frit, e.g., over 100 milliohms.

OBJECTS OF THE INVENTION

A primary object of this invention is to provide an improved method of manufacturing electrical contacts comprising aluminum for solar cells and other semiconductor devices that are solderable and provide low resistance.

Another object is to provide aluminum contacts for solar cells and other semiconductor devices that offer the advantages of smoother surfaces and resistance to corrosion.

A more specific object with respect to manufacture of photovoltaic solar cells is to (1) avoid the above-described surface irregularities of aluminum back contacts and (2) reduce the aluminum/silver contact resistance that characterizes prior "window" type back contacts formed by pad printing.

Still another object is to provide solar cells with aluminum/silver back contacts of the character described that include nickel for the purpose of reducing the aluminum/silver contact resistance.

A further object of the invention is to provide an improved method of making aluminum contacts that is characterized by use of an aluminum paste or ink that contains a glass frit.

Still another object is to provide improved fired aluminum contacts according to the "windows" concept, and a new method of making same.

A further specific object of this invention is to provide a new and improved "double fire" process for forming contacts on solar cells.

A further specific object is to provide an improved method of making aluminum/silver back contacts for silicon solar cells and other semiconductor devices that are characterized by an aluminum layer that is alloyed with the silicon substrate and has a plurality of windows through which the substrate is exposed, and air-fired silver soldering pads filling said windows and bonded to said substrate.

The foregoing and other objects hereinafter described, implied or rendered obvious are achieved by a novel double fire process for providing contacts on solar cells that is characterized by introducing nickel into the rear contact construction. The nickel serves to reduce the contact resistance between the aluminum contact material and the silver pads. In one embodiment, the nickel is applied, preferably by pad printing, as an intermediate layer between the silicon substrate and each silver pad. In a second and preferred embodiment, the nickel is incorporated into the silver ink that is used to make the soldering pads. In the latter case, the nickel comprises between about 1.0 and about 5.0 wt. % of the ink or paste, preferably about 1-2 wt %.

One preferred aspect of the invention comprises applying an aluminum ink or paste containing a glass frit, preferably by pad printing, onto a silicon substrate so as to form a back coating, and thereafter the back coating is fired so as to cause the aluminum particles in the ink to alloy to the substrate. The glass frit acts to (1) reduce the occurrence and size of irregularities in the aluminum layer, (2) substantially eliminate surface oxidation of the aluminum layer, and (3) render the contact more resistant to electrolyte induced corrosion. In a second aspect of the invention, an aluminum ink without a glass frit is used, but the results as to the quality of the aluminum rear contact are not as satisfactory as when using an aluminum ink containing a glass frit.

In its preferred form, the novel "double-fire" process results in formation of a rear contact on a solar cell wherein (1) a windowed aluminum layer is first formed on the rear surface of the partially finished silicon solar cell by pad printing, using an aluminum ink or paste that contains a glass frit, (2) the aluminum ink or paste is fired without any intervening drying step, (3) soldering pads are formed by pad printing an ink or paste that comprises silver, nickel and a glass frit so as to fill and overlap the windows, and (4) the silver/nickel/ glass frit ink or paste is fired (with or without intervening steps) so as to cause the constituents thereof to make an ohmic bond with the aluminum and the silicon substrate.

In the manufacture of solar cells, the foregoing procedure is integrated with the formation of a silver grid contact on the front side of the solar cell substrate, with the silver grid contact construction involving applying a patterned coating of a fritted silver ink or paste over a previously formed silicon nitride anti-reflection layer, and firing the fritted ink or paste so as to cause it to pass through the silicon nitride and form an ohmic contact with the substrate. In this preferred embodiment of the invention, the silver grid contact is fired simultaneously with the silver soldering pads.

Other features and many of the attendant advantages of the invention are described or rendered obvious by the following detailed description which is to be read in conjunction with the accompanying drawings.

BRIEF DESCRIPTION OF THE DRAWINGS

In the various figures, like numerals designate like parts.

Figure 1:
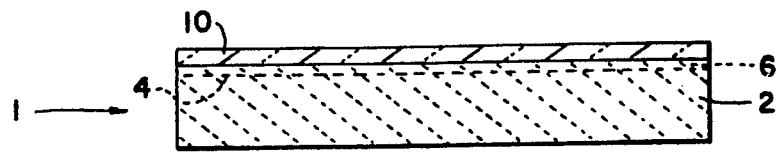
FIG. 1 is a side view in elevation of a silicon substrate having a P-N junction adjacent a first surface thereof and a dielectric anti-reflection coating covering said first surface.
Figure 2:
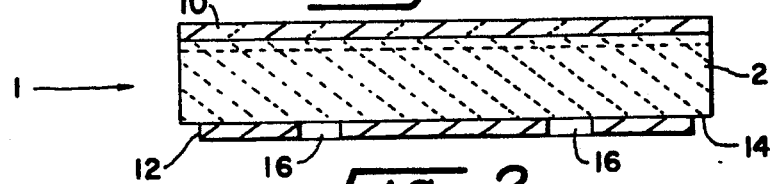
FIG. 2 is a view like FIG. 1, with one layer shown in section, showing application of a windowed aluminum ink or paste to the silicon substrate, with the ink or paste shown in section.

It is to be appreciated that, for convenience of illustration and also in order to facilitate understanding of the invention, at least some of the features and components illustrated in the drawings, in particular the relative thicknesses of the substrate and the various layers on the substrate, the depth of the junction and the N+ and P+ regions, the spacing and size of the silver soldering pads, and the spacing between and the relative sizes of the openings formed in the anti-reflection dielectric layer on the substrate, are not drawn to scale.

DETAILED DESCRIPTION OF THE INVENTION

It is believed that the invention is best utilized and much more beneficial from the standpoint of cost and ease of solar cell production, especially when the substrates are EFG-grown material, if pad printing is used to form the back contacts. However the advantages of the invention are attained even if screen printing or other techniques are used to form the back contacts on silicon substrates, regardless of the source of the substrates or how the substrates are produced. The significant thing is that the invention makes it possible to apply aluminum/silver contacts to solar cells so that the cells exhibit low contact resistance and improved or more consistent efficiency.

Referring now to the drawings, the preferred embodiment of the invention is described in relation to the production of solar cells from P-type silicon ribbon. For this embodiment, there is provided as a starting piece a partially finished cell i (FIG. 1) that comprises a substrate 2, preferably in the form of a length of P-type conductivity silicon ribbon produced by the EFG method, that has been processed so that one side (hereafter the "front side") has been provided with a relatively shallow junction 4 (e.g., a junction having a depth of between about 3000 and about 7000 angstrom units), an N-type (typically N+) conductivity region 6, and a dielectric layer 10 overlying the front surface of the silicon substrate that functions as an anti-reflection ("AR") coating. Various dielectric materials may be used as an AR coating, e.g., silicon nitride, titanium dioxide and silicon dioxide. Preferably the dielectric layer 10 comprises a species of silicon nitride.

To the extent already described, the partially finished cell may be fabricated by various methods and means well known in the art. For instance, junction 4 and N+ conductivity region 6 may be formed in P-type silicon substrate 2 by the diffusion of phosphorous from a gaseous or solid source. The silicon nitride layer 10 also may be formed in various ways, but preferably it is formed by a plasma vapor deposition process as disclosed in U.S. Pat. No. 4,751,191, issued Jun. 14, 1988 to Ronald C. Gonsiorawski et al for "Method Of Fabricating Solar Cells With Silicon Nitride Coating". To the extent necessary, the information disclosed in U.S. Pat. No. 4,751,191 is incorporated herein by reference.

Figure 3:
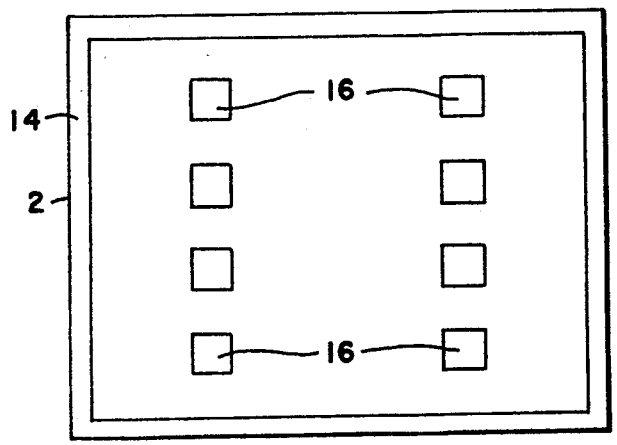
FIG. 3 is a bottom plan view of the silicon substrate showing the configuration of the aluminum ink paste.
Figure 4:
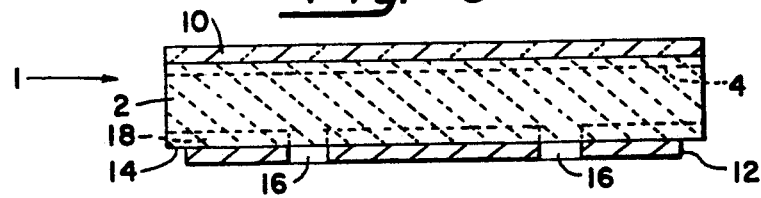
FIG. 4 is a view like FIG. 2 illustrating the device shown in FIG. 3 after it has been heat treated to alloy the aluminum of the aluminum ink or paste to the substrate.

Referring now to FIGS. 2-5, the first step in converting the partially finished cell 1 to a finished solar cell comprises covering the rear side of the substrate with a coating 12 of an aluminum ink or paste containing a glass frit so that all of the rear side of the substrate is coated except for a rectangular marginal portion 14 and a plurality of rectangular apertures 16. Preferably apertures 16 are arranged in two parallel rows as shown in FIG. 3. Then the aluminum/glass frit ink is fired by heating the substrate in nitrogen at a temperature of from about 670 to 850 degrees C., preferably about 760 degrees C. This firing eliminates the organic vehicle component of the aluminum ink and causes the aluminum particles in admixture with the glass frit to alloy with the silicon substrate. The firing of the aluminum ink also produces a P+ region 18 (FIG. 4).

Figure 5:
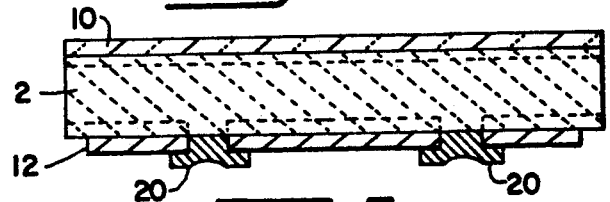
FIG. 5 is a view like FIG. 2 showing how the silver soldering pads are deposited in the window of the aluminum layer, with the aluminum and silver pads shown in section.

The next step involves printing a silver ink or paste onto the window areas, i.e., the areas of the surface of the substrate exposed by windows 16, so that the paste overlaps the aluminum layer 12 by between about 0.015" and about 0.030" at each side of each window. The silver ink contains a glass frit and a small amount of nickel. FIG. 5 illustrates that the resulting soldering pads 20 are generally T-shaped in cross-section, with the pads overlapping and making electrical contact with aluminum layer 12. Thereafter the silver ink or paste is dried in an oven in an air or nitrogen atmosphere heated to a temperature of about 100-150 degrees C. This drying step involves heating the substrate for between about 2 and about 20 minutes at the aforesaid temperature.

Figure 6:
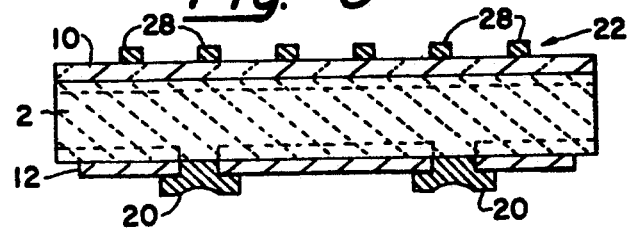
FIG. 6 is a view like FIG. 5 showing how a metal ink is applied to the front side of the same structure in the pattern of a grid electrode.
Figure 7:
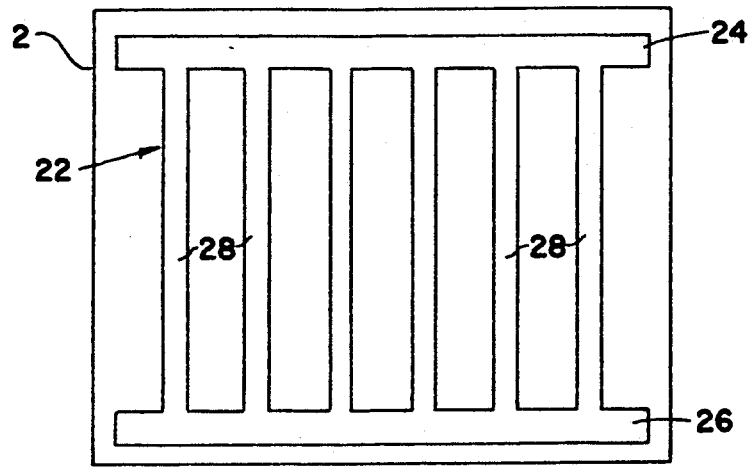
FIG. 7 is a plan view illustrating the configuration of the grid electrode.

Then a silver paste or ink is applied onto the front side of the substrate in overlying relationship with the silicon nitride coating so as to form a coating 22 (FIGS. 6-7) that is arranged so as to define a predetermined electrode pattern calculated to provide areas of electrical contact with the substrate and also areas where incident solar radiation can pass through the silicon nitride layer to the region of P-N junction 4, whereby to produce a photovoltaic effect. Preferably the silver paste or ink is applied so as to define a narrow grid electrode comprising a plurality of narrow fingers attached at one or both ends by a bus bar or runner. One form of suitable grid electrode is described in U.S. Pat. No. 3,686,036. Preferably, but not necessarily, as shown in FIG. 7, the grid electrode pattern comprises a pair of parallel spaced bus bars 24 and 26 and a plurality of narrow elongated fingers 28 extending between the two bus bars.

The grid-defining silver paste or ink coating 22 may be applied to the front side of the substrate using any of the known techniques which are commonly used in the electronics industry, including screen printing, pad printing and direct writing. The silver ink making up the coating 22 necessarily comprises a glass frit that permits the ink to permeate and pass through the silicon nitride so as to allow the silver component of the silver ink to reach and form an ohmic contact with the silicon substrate.

Figure 8:
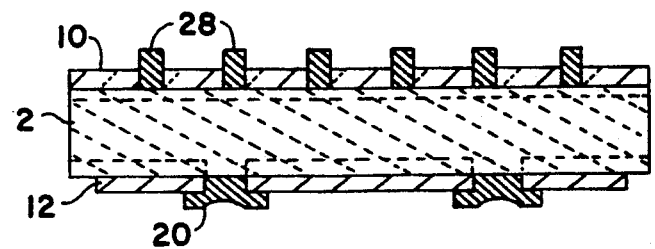
FIG. 8 is a view like FIG. 6 showing the grid electrode in section after it has been fired.

Thereafter the entire assembly is fired so that simultaneously (1) the silver ink layer 22 is caused to pass through the silicon nitride and form an ohmic contact with the underlying upper surface of the substrate, and (2) the silver ink forming pads 20 are bonded to the silicon substrate and also to the aluminum that they overlap. Firing of the silver paste that makes up the front electrode layer 22 and the silver paste that makes up the solder pads 20 is conducted in a infra-red furnace with an air or oxygen-containing atmosphere. The firing temperature and time may vary, but in any case the firing temperature and time should be adequate to volatilize or pyrolyze or otherwise remove the organic constituents of the silver inks and melt the glass frit in layer 22 until that layer 22 passes through the silicon nitride layer and bonds to the underlying substrate. It has been determined that firing of the silver inks, particularly the ink applied over the silicon nitride, is best conducted by heating the substrate to a peak temperature of between about 750 and 850 degrees C for about 5-10 seconds, with the peak temperatures preferably being about 780 degrees C. FIG. 8 shows how the finger portions 28 of the silver layer 22 extend through the silicon nitride layer after being fired as above described.

The concept of firing metal contacts through an antireflection dielectric coating is disclosed in U.S. Pat. No. 4,737,197, issued to Y. Nagahara et al for "Solar Cell With Metal Paste Contact" and also by copending U.S. patent application Ser. No. 205,304, filed Jun. 10, 1988 by Jack I. Hanoka for "An Improved Method Of Fabricating Solar Cells".

Figure 9:
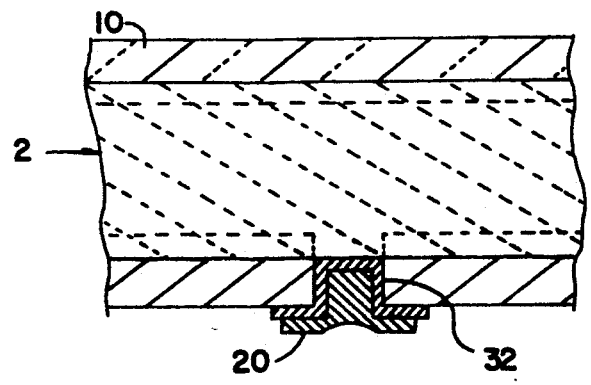
FIG. 9 is a view like FIG. 8 showing an alternative embodiment of the invention.

As suggested above, the present invention is characterized by disposing nickel metal between the back contact aluminum layer and the silver component of the soldering pads. The preferred embodiment of the invention already described comprises incorporating the nickel into the silver paste used to form the soldering pads 20. Alternatively, as shown in FIG. 9, nickel is deposited in windows 16 as nickel interphase pads 32 that overlap the aluminum at each edge of windows 16, and the silver pads 20 are deposited over the nickel pads. The silver and nickel pads 20 and 32 are preferably fired simultaneously in air.

A number of printing inks have been used satisfactorily to practice the present invention. Essentially the inks may be conventional silk screen printing inks, i.e., commercially available inks, which may need to be diluted to provide a fluidity suitable for pad printing. Of course, the specific composition of conventional commercially-available silk screen printing inks is proprietary to the manufacturers of the inks, and the relative concentrations of metal particles, glass frit and organic constituents in the paste or inks may vary according to the manufacturer.

Conventional screen printing inks generally have a viscosity of about 1000 poise at 25 degrees C and a shear rate of 10/sec. For pad printing contacts according to this invention, the inks should have a viscosity of about 50 poise at 25 degrees C. and a shear rate of 10/sec.

The printing inks found to be useful in practicing this invention contain the desired metal particles (such as particles of aluminum, silver, and nickel) in a vehicle that may comprise both an organic binder such as ethyl cellulose and a solvent such as terpineol or Carbitol (diethylene glycol monoethyl ether).

In the case of silver inks, and also in the case of nickel inks, the ink that is applied to the substrate contains between about 50 and 75 wt. % metal particles and between about 4 and about 15 wt. % of a glass frit, with the remainder of the ink consisting of an organic vehicle. In the case where the aluminum ink contains no glass frit, the concentration of aluminum particles in the ink that is applied to the substrate ranges from between about 70 and 85 wt. %, with the remainder of the ink consisting of the organic vehicle. The aluminum inks containing a glass frit are formulated so that when they are applied to the substrate they contain about 50–70 wt % aluminum particles, 10–40 wt % glass frit, and 5–15 wt % organic vehicle. In the case where nickel is incorporated into the silver ink used to form the soldering pads, the nickel concentration in the ink is in the range of about 1 to about 5 wt. %, and is preferably between 1.0 and 2.0 wt. %.

Preferably a frit of lead borosilicate glass or a lead silicon glass is used in the aluminum, silver and nickel inks. The glass frit comprises 5–80 wt. % lead and up to 40 wt. % silicon oxide in the case of a lead silicon glass, and 5–80% lead, 1–40% silicon oxide and 1–30% boron oxide in the case of a lead borosilicate glass. Preferably the glass frit used is a lead borosilicate glass.

For the purpose of applying aluminum contacts to a solar cell substrate according to one aspect of this invention, an aluminum screen printing ink identified as ESL No. 2592, manufactured by Electro Science Labs of Pennsylvania, has been used. In its manufactured or as-sold state, the No. 2592 aluminum ink is believed to contain between about 60–75 wt. % aluminum particles, between about 10 to 30 wt. % lead borosilicate glass frit, and between 5 to 15 wt. % of organics comprising a binder such as ethyl cellulose and a solvent such as Carbitol or terpineol. That No. 2592 ink is diluted by addition of Carbitol or terpineol, in an amount in the range of 2–30 wt. % of the starting ink composition, to as to achieve a fluidity suitable for printing of aluminum contacts on a silicon substrate using a conventional pad printing machine. The diluted ink has a viscosity of about 50 poise at 25 degrees C. and a shear rate of 10/sec.

This invention also has been practiced satisfactorily by pad printing aluminum contacts using custom aluminum inks comprising aluminum and glass frit in varying ratios, e.g., having aluminum and glass frit in a 1:1 to 3:1 weight ratio, with the organic vehicle constituting up to about 5–15 wt. % of the ink. These inks were formulated so as to have a viscosity of about 50 poise at 25 degrees C. and a shear rate of 10/sec.

In the practice of this invention, silver contacts have been applied to the rear side of a silicon substrate by pad printing using a conventional silver screen printing ink manufactured by Ferro Company and identified by product No. 3398. The No. 3398 ink contains about 3 wt % aluminum particles and was diluted by adding Carbitol in an amount equal to 5–20 weight percent of the ink, so as to give it a viscosity of about 50 poise as indicated above. Another Ferro custom-made silver ink DP33-072 has also been used to apply silver contacts to the rear side of a silicon substrate. That custom-made ink also contains about 3 wt. % aluminum and also had a viscosity of about 50 poise and hence did not require dilution. The Ferro No. 3398 and the Ferro No. DP33-072 inks both contain a glass frit.

A Ferro No. 3349 silver ink containing a glass frit but free of aluminum has also been used to form back contacts and also front grid contacts. For pad priting the No. #3349 ink was diluted by addition of Carbitol in an amount equal to 2–30 weight percent of the ink.

In forming both the front and rear contacts, the ink is applied so as to have a thickness in the range of about 2 mils to about 4 mils before firing and a thickness of 4–10 microns after firing.

As noted above, firing serves to pyrolyze the organic binder and fuse the metal compound in the ink to the substrate so as to form a good ohmic contact. In the case of an aluminum ink, the aluminum will form an alloy with the silicon substrate. The specific parameters of the firing process will vary depending upon a number of factors, the primary one of which is the composition of the printing ink. Preferred specific firing conditions are described hereinafter in connection with the examples of the present method described below.

Depending upon the desired thickness of the metallized contacts to be applied to the substrate 2, one or more additional layers of ink may be applied on top of the existing ink using the above-described procedure. Such additional layers of ink may be applied before or after the first-applied layer of ink has been dried and/or fired.

EXAMPLE NO. 1

Referring to FIGS. 1–8, the method of the present invention is used to apply an aluminum back contact 12 and silver soldering pads 20 and also a front grid contact 22 to a solar cell in the form of a polycrystalline EFG-grown silicon substrate 2 that measures approximately four inches long by four inches wide, and has a shallow P-N junction formed therein at a depth of about 0.5 microns below its front surface, and an anti-reflection coating on its front surface in the form of a layer 10 of silicon nitride having a thickness of about 800 Angstroms. The back aluminum contact 12 comprises a plurality of windows 16 arranged symmetrically in two parallel rows as shown in FIG. 3, and also terminates short of the edges of the substrate so as to leave exposed a peripheral portion 14 of the rear surface of the substrate. The silver pads 20 are formed in the apertures 16 so as to contact the substrate.

Back aluminum contact 12 is applied using a conventional pad printing machine. The pad printing machine comprises a gravure plate having a rectangular recessed portion formed by etching with a width and length substantially identical to the corresponding dimensions of the back contact 12 to be applied to the silicon substrate, i.e. about 3.96" by 3.96". The depth of the etched portion of the gravure plate is about 3.5 mils. Positioned inside the etched portion of the gravure plate are a plurality of lands, the top surfaces of which are in coplanar relation with the top surface of the gravure plate.

The lands each have a rectangular configuration measuring about 0.150" by 0.150" and are arranged in two parallel rows.

Aluminum back contact 12 is applied using an aluminum/glass frit screen printing ink, such as the ink manufactured by Electro Science Labs identified by product code ESL No. 2592. The No. 2592 screen printing ink is diluted by the addition of about 15 weight percent of carbitol before the ink is applied. Satisfactory results have also been obtained when the same ink has been diluted to other levels in the 2–30 weight percent range with the same solvent.

Prior to the first printing step, a mask (not shown) is positioned on the back surface of the substrate. The mask is made of Mylar having a thickness of about 5 mils, and is configured to block application of ink to only the peripheral edge portion 14 on the back surface of the substrate. Edge portion 14 has a width of about 0.04". The purpose of the mask is to assure that stray deposits of ink on portions of the surface of the gravure corresponding to marginal portion 14 will not be deposited on the rear surface of the substrate, thereby leaving the peripheral portion 14 free of ink.

On conclusion of the aluminum ink printing step, the mask is removed and the substrate is transferred to a furnace where it is fired to drive off the solvent and binder in the ink defining the printed contact 12 and cause the aluminum particles of the ink to alloy with the substrate. More specifically, using a conventional belt furnace having a 54" firing zone, the substrate is fired in a nitrogen ambient atmosphere for about three minutes to drive off the solvent, pyrolyze the binder and fuse the remaining metal component of the ink to the substrate. The firing is accomplished by ramping the substrate temperature from 200° C. to a level in the range of about 760° C., and then back down to 200° C. Then the substrate is removed from the furnace and allowed to cool in air to room temperature. The fired aluminum contact has a thickness of about 7 microns ±3 microns, and is characterized by a plurality of windows each measuring about 0.150" by 0.150".

It should be noted that if it is not desired to fire the substrate while the printed aluminum ink is still wet, the substrate may be dried in nitrogen or air at 100°–150° C. for 2–25 minutes. Thereafter, it may be fired in a nitrogen atmosphere, as described above.

The substrate is then subjected to a second pad printing operation using a second gravure plate. The second gravure plate is characterized by a plurality of etched depressions which correspond in shape and placement to the windows 16. The horizontal dimensions of the etched depressions in the second gravure plate exceed the corresponding dimensions of windows 16 by about 0.03", e.g., the depressions in the second gravure plate measure about 0.180" by 0.180". The depth of those depressions is also about 3.5 mils.

The second printing operation is for forming the silver soldering pads. This is accomplished using a silver ink that contains nickel. More precisely, the silver ink contains by weight between about 50 and about 75 wt. % silver, between about 1 and about 5 wt. % nickel, between about 5 and about 15 wt. % lead borosilicate glass frit, and the remainder organic vehicle. The ink has a viscosity of about 50 poise at 25 degrees C. and a shear rate of about 10/sec. The second printing operation is carried out using essentially the same kind of pad printing machine as is used for forming aluminum contact 12.

The second printing operation is performed in substantially the same manner as the first printing operation described above, except that the back side of the substrate is not masked prior to printing. The placement of the second gravure plate and its etched depressions are set so that the silver printing ink is deposited precisely in the rectangular apertures 16 in aluminum back contact 12 and also so as to overlap that aluminum contact by about 0.03" at each side of those apertures. FIG. 6 illustrates that silver pads 20 are generally T-shaped in vertical cross-section, with the pads overlapping and making electrical contact with aluminum layer 12. The silver ink applied in the second printing operation is then dried in air at a temperature of about 125 degrees C. for approximately 15 minutes.

Thereafter a third printing or writing operation is conducted for the purpose of forming a grid contact 22 (FIG. 7) on the front side of the substrate. The printing or writing operation causes the front contact to have a pattern or configuration corresponding to that of bus bars 24 and 26, and a plurality of fingers 28.

The front grid contact is applied using a standard silver/glass frit screen printing ink that contains no aluminum, e.g., the ink manufactured by Ferro Company of Santa Barbara, California identified by product code No. 3349. Although the specific composition of the No. 3349 ink is proprietary, it is believed that in its as-sold state it consists of about 65–80 wt. % silver, about 5 wt. % lead borosilicate glass frit, and about 15 wt. % liquid vehicle comprising an organic binder such as ethyl cellulose and a solvent such as terpineol or Carbitol. If the front grid contact is formed by pad printing, the No. 3349 ink is diluted by addition of about 10 weight percent Carbitol. Satisfactory pad printing results have also been achieved when the Ferro 3349 ink was diluted by addition of Carbitol in different amounts in the 2–30 wt. % range.

After the third printing operation, the substrate is fired for three minutes in an infra-red furnace, in an air ambient atmosphere, with the temperature being ramped up from 200° C. to a peak temperature of about 780 degrees C. and ramped back down to 200° C. The substrate is held at the peak temperature of about 780° C. for about 5 seconds. The firing results in (1) the silver ink in apertures 16 forming an ohmic contact with the adjacent aluminum and the underlying silicon substrate, and (2) the silver ink overlying the silicon nitride layer passing through the silicon nitride layer and forming an ohmic contact with the silicon substrate. Following the firing, the substrate is cooled to room temperature in air. Thereafter, several additional conventional fabrication steps may be performed on the substrate so as to produce a working solar cell ready to be connected to other solar cells.

EXAMPLE NO. 2

In this example the procedure is the same as in Example No. 1, except that the aluminum ink does not contain a glass frit and instead it consists of 70–85 wt. % aluminum particles, and 15–30 wt. % organic vehicle.

The resulting cells will perform well, but will not exhibit equal physical properties as cells made according to Example 1. Tests have indicated that if no glass frit is contained in the aluminum ink, the efficiency of the cell may be as good as cells made in accordance with Example 1, but the aluminum contact is not as flat and smooth due to the occurrence of surface irregularities in the form of bumps, and corrosion resistance of the cell is lowered.

EXAMPLE NO. 3

In this example, the procedure is the same as in Example No. 1, except that the silver ink used to form the silver soldering pads 20 does not contain nickel, but instead formation of the silver soldering pads is preceded by the pad printing of nickel interphase pads 32 (FIG. 9) in apertures 16 before the pad printing of the silver soldering pads. The nickel interphase pads are formed by pad printing a nickel ink that comprises between about 50 and about 75 wt. % nickel particles and between about 4 and about 15 wt. % glass frit, with the remainder a vehicle as described in Example 1. The nickel pads are dried in air at a temperature of about 125 degrees C. for a time in the range of about 2 to about 20 minutes. Then the silver pads are printed on top of the nickel layers using a silver particle/glass frit ink (which may or may not contain aluminum), e.g., Ferro inks Nos. 3349, 3398 and DP33-072. Following writing or printing of the front grid contact, the device is fired in air according to the procedure of Example 1. Cells made according to this example perform well and exhibit physical properties and efficiency equal to cells made according to Example 1. However, this approach is not preferred due to the added cost of forming a separate nickel layer.

Example No. 1 exemplifies the preferred mode of practicing this invention.

It is to be noted that the preference that the silver pads 20 (and nickel pads 32) overlap the aluminum back contact 12 (as shown in FIGS. 6, 8 and 9), results in part from a desire to avoid or overcome any printer registration problems and in part from a desire to increase the electrical contact area between pads 20 and 32 and the rear aluminum layer 12. Preferably, as noted above, the overlap is about 0.03 inch. Nevertheless it also is contemplated that the silver pads (and also the nickel pads) may be formed so as to fully fill the apertures 16 without any overlap.

While substrate temperatures of 750-850 degrees may be used for firing silver pastes on the front and rear sides simultaneously, a temperature of about 780 degrees C. is preferred. The substrate should be kept at a temperature in the range of 750-850 degrees C. for a relatively short period of time, preferably for between 5-10 seconds. A belt furnace as mentioned in Example 1 is preferred for firing the substrates. In such a furnace the conveyor belt runs at a constant speed, but the speed at which the belt is set to run may be varied within limits. Thus the conveyor speed may be set so that the time that each substrate is in the furnace is in the range of about 0.25 to about 2.0 minutes, including the time required to bring the substrate up to the peak firing temperature of 750–850 degrees C. By way of example, if the furnace contains ambient air heated to a temperature of about 850 degrees C., the speed of the conveyor belt is set so that the substrate reaches a peak temperature of about 780 degrees C. and remains at that temperature for about 5 seconds, after which it is cooled down at a selected rate. During the firing, the organics in the silver inks or pastes volatilize or burn off. Additionally, in the case of silver ink layer 22, the glass frit becomes fluid and fires through the silicon nitride layer so as to cause the silver component of the ink to form an ohmic contact with the silicon substrate. In the case of the silver soldering pads 20, the firing causes the silver and glass constituents to bond to the underlying substrate and also the adjacent aluminum contact layer.

It is to be appreciated that the nickel interphase pads 32 may be fired separately from the silver pads 20 and/or the front grid electrode. In such case, the nickel pads 32 may be fired at the same temperature and for the same time as the silver soldering pads, with the firing occurring in a nitrogen atmosphere.

Of course, the invention is not limited to formation of solar cells wherein the front grid contact is fired through an AR or other dielectric coating, e.g., a dielectric material such as silicon nitride, silicon dioxide or titanium dioxide. Instead the front surface of the silicon substrate may be free of any dielectric coating at the time that the silver/glass frit ink or paste used to form the front grid electrode is applied to that surface, in which case firing of the silver/glass frit ink or paste under the temperature and time conditions described above will cause the ink or paste to bond directly to that front surface. In such case, an AR coating may be applied after the front grid contact has been fired. Also the substrate may have a front AR coating which is etched through to the substrate so as to define a suitable grid pattern, and the silver ink or paste may be applied so as to cover the grid-defining areas of the front surface exposed by the etching operation, with the ink then being fired in the same way as described above.

The present method has been described primarily as a technique for applying metallized contacts to crystalline silicon solar cell substrates, but it is to be appreciated that the present method may also be satisfactorily employed in the fabrication of other semiconductor devices. Although the present invention is advantageous in relation to solar cell substrates having uneven surfaces, such as substrates grown by the EFG process, it may be satisfactorily used to form contacts on a wide range of semiconductor substrates and devices. Also the invention may be practiced using screen printing, direct write or other techniques for forming or printing the front as well as the back contacts.

It should be appreciated that the use of nickel to reduce the contact resistance is advantageous whether or not the aluminum ink contains a glass frit, although the use of nickel is most necessary and advantageous if a glass frit is present in the aluminum ink. The use of a fritted aluminum ink to form the rear contact improves the physical quality of the contact and renders it more resistant to electrolyte induced corrosion, but the contact resistance in relation to the silver pads tends to be excessive. The use of nickel as described above reduces the contact resistance and thus makes viable the use of a fritted aluminum.

A further advantage is that the nickel may be used according to two separate modes. As noted above, in the preferred mode of practicing the invention, the nickel is incorporated in the silver ink used to form the soldering tabs. In the second and alternative mode, the nickel is applied as a separate layer that underlies the silver soldering pads. The preferred form of double-fire process embodying this invention uses an aluminum ink containing a glass frit and incorporates nickel in the silver ink used to form the solder pads.

Since certain changes may be made in the above process without departing from the scope of the invention herein involved, it is intended that all matter contained in the above description or shown in the accompanying drawings shall be interpreted in an illustrative and not in a limiting sense. The present invention is indicated by the broad general meaning of the terms in which the appended claims are expressed.

What is claimed is:

1. A method of making a solar cell, comprising the steps of:
   (a) providing a silicon substrate having first and second opposing surfaces and a P-N junction adjacent said first surface;
   (b) applying to said second surface a first composition comprising aluminum metal particles and a glass frit in a liquid vehicle so as to form a first aluminum-containing coating that covers all but at least one selected area of said second surface;
   (c) firing said substrate in a non-oxidizing atmosphere so as to effect removal of said liquid vehicle and alloying of said aluminum metal particles with silicon at said second surface;
   (d) applying a second composition comprising silver and nickel metal particles and glass frit in a liquid vehicle so that said second composition forms a second coating that covers said at least one selected area of said second surface and also overlaps the edges of the alloyed aluminum that surrounds said at least one selected area; and
   (e) firing said second composition in an oxygen-containing environment so as to effect removal of said liquid vehicle from said second composition and cause the silver and nickel particles in said second composition to fuse to said substrate and the alloyed aluminum that surrounds said at least one selected area.

2. A method according to claim 1 wherein step (e) is accomplished by heating said substrate to a temperature of at least 750 degrees C. for at least about 5 seconds.

3. A method according to claim 1 wherein said second composition is dried in air at a temperature of about 100–150 degrees C. before it is subjected to step (e).

4. A method according to claim 1 wherein in step (c) said substrate is heated to a temperature of 670 to 850 degrees C. in order to alloy said aluminum to said substrate.

5. A method according to claim 1 wherein said first composition is applied to said substrate by pad printing.

6. A method according to claim 1 wherein said first composition comprises aluminum particles and a glass frit suspended in a vehicle comprising a vaporizable organic solvent and an organic binder.

7. A method according to claim 1 wherein said first and second compositions are inks and said inks are applied to said substrate by pad printing.

8. A method according to claim 1 wherein said second composition contains between about 1.0 and 5.0 wt. % nickel.

9. A method according to claim 1 wherein said at least one selected area comprises at least two mutually spaced portions of said second surface.

10. A method according to claim 9 wherein step (b) is accomplished by pad printing, and further wherein at least one selected second area of said second surface of said substrate is masked prior to step (b) so as to prevent said first composition from being applied to said at least one second selected area of said second surface.

11. A method according to claim 10 wherein said second composition is applied to as to cover said at least two mutually spaced portions of said second surface and adjacent portions of the alloyed aluminum formed by firing of said first composition.

12. A method according claim 1 wherein said first surface of said substrate is covered by a layer of a dielectric material before application of said first and second compositions.

13. A method according to claim 12 wherein said dielectric material is silicon nitride, silicon dioxide or titanium dioxide.

14. A method according to claim 12 further including the following step:
   (f) after step (d) applying to selected portions of said layer of dielectric material a third composition comprising silver metal particles and a glass frit in a liquid vehicle so as to form a third silver-containing coating in the form of a grid electrode pattern, whereby when said substrate is fired according to step (e), said third composition will penetrate said dielectric layer and form an ohmic bond with said first surface of said substrate.

15. A method according to claim 14 wherein step (e) is conducted so that the substrate is heated to a temperature of 750–850 degrees C. for between about 5 and 10 seconds.

16. A method of making a solar cell, comprising the steps of:
   (a) providing a silicon substrate having first and second opposite surfaces and a P-N junction adjacent said first surface;
   (b) applying a first composition comprising aluminum metal particles and a glass frit in a liquid vehicle so as to form a first aluminum-containing coating that covers all but at least one selected area of said second surface;
   (c) firing said substrate in a non-oxidizing atmosphere so as to effect removal of said liquid vehicle and alloying of said aluminum metal particles with silicon at said second surface;
   (d) applying to said second surface a second composition comprising nickel metal particles and a glass frit in a liquid vehicle so that said second composition forms a second coating that covers said at least one selected area of said second surface and also overlaps the edges of the alloyed aluminum that surrounds said at least one selected area;
   (e) applying a third composition comprising silver metal particles and a glass frit in a liquid vehicle so that said third composition forms a third coating that covers said second coating; and
   (f) firing said second and third compositions in an oxygen-containing environment so as to effect removal of said liquid vehicle from said second and third compositions and (a) cause the nickel in said second composition to bond to said substrate and the overlapped edges of the alloyed aluminum that surrounds said at least one selected area, and (b) cause the silver in said third composition to bond to the bonded nickel from said second coating.

17. A method accord claim 16 wherein in step (e) said third composition further comprises about 3 wt. % aluminum.

18. A method according to claim 16 wherein said first surface of said substrate is covered by a layer of a dielectric material before the application of said first composition.

19. A method according to claim 18 wherein step (f) is preceded by the step of applying to selected portions of said layer of dielectric material a fourth composition comprising silver metal particles and a glass frit in a liquid vehicle so as to form a fourth coating in the form of a grid electrode pattern, whereby when said substrate is fired according to step (f) said fourth composition will penetrate said dielectric layer and form an ohmic bond with said first surface of said substrate.

20. A method according to claim 19 wherein said dielectric layer is silicon nitride.

21. A method of making a solar cell, comprising the steps of:
   (a) providing a silicon substrate having first and second opposite surfaces and a P-N junction adjacent said first surface;
   (b) applying to said second surface a first composition comprising aluminum metal particles and a glass frit in a liquid vehicle so as to form a first aluminum-containing coating that covers all but at least one area of said second surface;
   (c) firing said substrate in a non-oxidizing atmosphere so as to effect removal of said vehicle and alloying of said aluminum metal particles with silicon at said second surface;
   (d) applying a second composition comprising silver and nickel metal particles and a glass frit in a liquid vehicle so that said second composition forms a second coating that covers said at least one area of said second surface and also overlaps the edges of the alloyed aluminum coating that surrounds said at least one area;
   (e) applying a third composition comprising silver metal particles and glass frit in a liquid vehicle so that said third composition forms a third coating that covers selected areas of said first surface so as to define a grid electrode pattern; and
   (f) firing said second and third compositions in air so as to effect removal of said liquid vehicle from said second and third compositions and cause the silver and nickel in said second composition to form an ohmic contact with said aluminum layer and the silver in said third composition to form an ohmic contact with said first surface of said substrate.

22. A method of forming an aluminum contact with silver soldering pads on a silicon semiconductor substrate, comprising the steps of:
   (a) providing a silicon substrate having first and second opposing surfaces;
   (b) applying to said second surface a first composition comprising aluminum metal particles and a glass frit in a liquid vehicle;
   (c) firing said substrate and said first composition in a non-oxidizing atmosphere so as to effect removal of said vehicle, and alloying of said aluminum metal particles with silicon at said second surface;
   (d) applying over said fired composition a second composition comprising silver and nickel particles and a glass frit in a liquid vehicle; and
   (f) firing said second composition in an air atmosphere so as to cause said silver and nickel particles to form an electrically conductive contact with the aluminum particles of said first composition.

23. A method according to claim 22 wherein said first composition if fired in a nitrogen atmosphere.

24. A method according to claim 22 wherein the glass in said second composition comprises a lead borosilicate glass.

25. A method of making a solar cell, comprising the steps of:
   (a) providing a silicon substrate having first and second opposite surfaces, a P-N junction adjacent said first surface, and a dielectric layer covering said first surface;
   (b) applying to said second surface a first composition comprising aluminum metal particles in a liquid vehicle so as to form a first aluminum-containing coating that covers all but at least one area of said second surface;
   (c) firing said first coating in a non-oxidizing atmosphere so as to effect removal of said vehicle and alloying of said aluminum metal particles with silicon at said second surface;
   (d) applying to said second surface a second composition comprising particles of silver metal, particles of nickel metal, and particles of a borosilicate glass in a liquid vehicle so that said second composition forms a second coating that covers said at least one area of said second surface and also overlaps the edges of the alloyed aluminum coating that surrounds said at least one area;
   (e) drying said second composition;
   (f) applying to said dielectric layer a third composition comprising silver particles and a glass frit in a liquid vehicle so that said third composition forms a third coating that defines a grid electrode pattern; and
   (g) firing said second and third coatings in air so as to effect removal of the liquid vehicle from said second and third compositions and (a) cause the silver and nickel metal in said second composition to bond to said substrate and form an ohmic contact with the alloyed aluminum, and (b) cause the silver and glass frit components of said third composition to penetrate said dielectric layer and bond to said first surface.

26. A method of making a solar cell, comprising the steps of:
   (a) providing a silicon substrate having first and second opposite surfaces, a P-N junction adjacent said first surface, and a dielectric layer covering said first surface;
   (b) applying to said second surface a first composition comprising aluminum metal particles in a liquid vehicle so as to form a first aluminum-containing coating that covers all but selected areas of said second surface;
   (c) firing said substrate in a non-oxidizing atmosphere so as to effect removal of said vehicle and alloying of said aluminum metal particles with silicon at said second surface;
   (d) applying to said selected areas of said second surface a second composition comprising particles of nickel metal and particles of a borosilicate glass in a liquid vehicle so that said second composition forms a second coating that covers said selected areas of said second surface and also overlaps the edges of the alloyed aluminum coating that surrounds said selected areas;
   (e) covering said second coating with a third coating of a third composition comprising particles of silver metal and frit of a borosilicate glass in a liquid vehicle;
   (f) applying to said dielectric layer a fourth composition comprising silver particles and a glass frit in a liquid vehicle so that said fourth composition forms a fourth coating that defines a grid electrode pattern; and
   (g) firing said second, third and fourth compositions in air so as to effect removal of the liquid vehicle from said compositions and (a) cause the silver and nickel metal in said second and third compositions to bond to said substrate and the adjacent alloyed aluminum, and (b) cause the silver and glass frit of the fourth composition to penetrate said dielectric layer and form an aluminum bond with said first surface.

27. A solar cell comprising a silicon substrate having first and second oppositely facing surfaces, a P-N junction formed adjacent said first surface, a layer of a dielectric overlying said first surface, said dielectric being a member of the class consisting of silicon nitride, titanium dioxide, and silicon dioxide, a first grid-shaped contact extending through portions of said layer of dielectric, said grid-shaped contact comprising silver and a glass frit bonded to said first surface, a second aluminum contact overlying said second surface, said second aluminum contact comprising aluminum alloyed with silicon at the interface of said substrate and said second contact, a plurality of silver-containing soldering pads bonded to said second contact, and nickel disposed so as to improve the contact resistance between said silver pads and said aluminum.

28. A solar cell according to claim 27 wherein said nickel is disposed as a discrete layer.

29. A solar cell according to claim 27 wherein said nickel is incorporated as a constituent of said silver-containing soldering pads.

30. A solar cell according to claim 29 wherein said second contact is formed with a plurality of apertures exposing selected portions of said second surface, and further wherein said silver soldering pads fill said apertures and are bonded to said selected portions of said second surface and said second contact.

31. A solar cell according to claim 30 wherein said silver-containing soldering pads extend beyond the peripheries of said apertures so as to overlap said second aluminum contact.

32. A solar cell according to claim 31 wherein said dielectric is silicon nitride.

33. A solar cell comprising a silicon substrate having first and second oppositely facing surfaces, a P-N junction formed adjacent said first surface, a layer of a dielectric overlying said first surface, said dielectric being a member of the class consisting of silicon nitride, titanium dioxide, and silicon dioxide, a first grid-shaped contact extending through portions of said layer of dielectric, said grid-shaped contact comprising silver and a glass frit bonded to said first surface, a second aluminum contact overlying said second surface, said second aluminum contact comprising aluminum alloyed with silicon at the interface of said substrate and said second contact, a plurality of silver-containing soldering pads bonded to said second contact, and nickel fused in contact with the aluminum of said second contact and the silver of said soldering pads.

34. A solar cell comprising a silicon substrate having first and second oppositely facing surfaces, a P-N junction formed adjacent said first surface, a layer of silicon nitride overlying said first surface, a first grid-shaped silver contact extending through portions of said layer of silicon nitride and bonded to said first surface, a second contact overlying and bonded to said second surface, said second contact comprising aluminum and a glass frit with the aluminum being alloyed with silicon at said second surface, said second contact being formed with a plurality of apertures that expose portions of said second surface, a plurality of soldering pads comprising silver filling said apertures and bonded to said second surface and adjacent portions of said second contact, and nickel disposed in electrically conductive relation with the silver component of said soldering pads and the aluminum of said second contact, so as to improve the contact resistance between said silver pads and said aluminum.

35. A solar cell according to claim 34 wherein said nickel is disposed as a discrete layer in each of said apertures, and said silver pads are bonded to said substrate by said nickel layers.

36. A solar cell according to claim 34 wherein said nickel is incorporated in said silver pads in admixture with the silver constituent thereof.

* * * * *

UNITED STATES PATENT AND TRADEMARK OFFICE
CERTIFICATE OF CORRECTION

PATENT NO. : 5118362
DATED : June 2, 1992
INVENTOR(S) : David A. St. Angelo et al It is certified that error appears in the above-identified patent and that said Letters Patent is hereby corrected as shown below:

Claim 1, column 15, line 7, "opposing" should be -- opposite --;

Claim 11, column 15, line 65, "to" (first occurrence) should be -- so --;

Claim 17, column 16, line 57, "accord" should be -- according --;

Claim 22, column 17, line 44, "opposing" should be -- opposite --; and

Claim 23, column 17, line 61, "if" should be -- is --.

Signed and Sealed this

Seventh Day of September, 1993

Attest:

BRUCE LEHMAN

Attesting Officer        Commissioner of Patents and Trademarks